United States Patent [19]

von Basse et al.

[11] 4,109,270

[45] Aug. 22, 1978

[54] SEMICONDUCTOR STORE

[75] Inventors: Paul Werner von Basse, Wolfratshausen; Rüdiger Hofmann, Munich, both of Germany

[73] Assignee: Siemens Aktiengesellschaft, Berlin & Munich, Germany

[21] Appl. No.: 789,953

[22] Filed: Apr. 22, 1977

[30] Foreign Application Priority Data

May 4, 1976 [DE] Fed. Rep. of Germany ....... 2619713

[51] Int. Cl.² ............................................. H01L 29/78
[52] U.S. Cl. ......................................... 357/23; 357/41; 357/45; 357/55
[58] Field of Search ........................ 357/23, 55, 41, 45

[56] References Cited

U.S. PATENT DOCUMENTS 3,893,155  7/1975  Ogiue ....................................... 357/23
4,003,036  1/1977  Jenne ....................................... 357/23

Primary Examiner—Edward J. Wojciechowicz
Attorney, Agent, or Firm—Hill, Gross, Simpson, Van Santen, Steadman, Chiara & Simpson

[57] ABSTRACT

A semiconductor store is disclosed comprising a semiconductor substrate of a highly doped semiconductor material of one conductivity type, an epitaxial layer on one surface of said substrate of the same conductivity type and of low doping, a buried layer lying partly in said substrate and partly in said epitaxial layer, said buried layer being of the opposite conductivity type and of high doping, a highly doped second layer of the same conductivity type as said buried layer in the outer surface of said epitaxial layer, a V-shape groove extending through said second layer, said epitaxial layer and said buried layer and penetrating into said substrate, an insulating layer covering said epitaxial layer and the walls of said V-shape groove, and a layer of conductive material covering said insulating layer, whereby a two-cell semiconductor store is provided.

5 Claims, 4 Drawing Figures

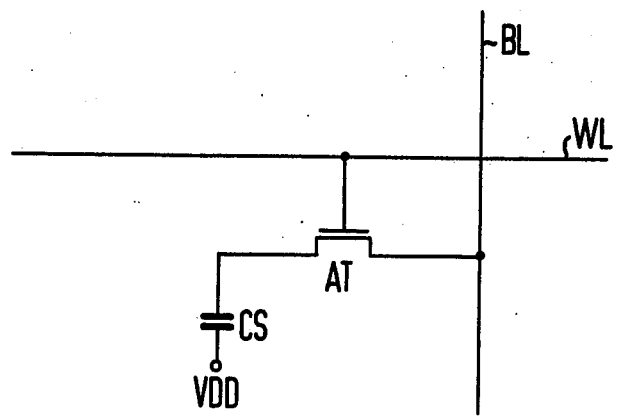
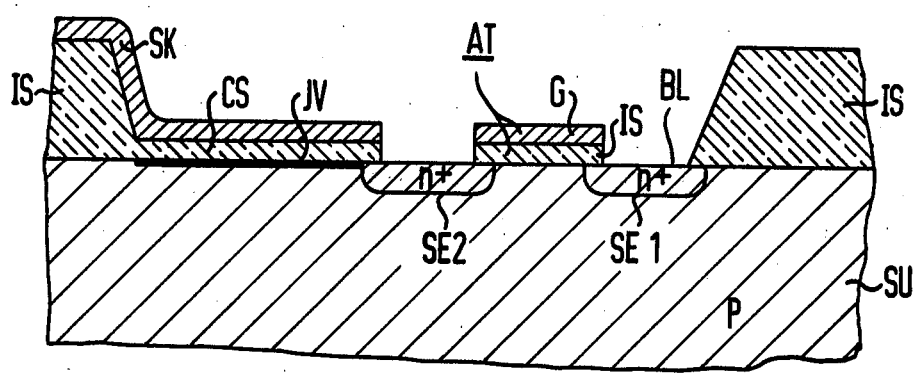

SEMICONDUCTOR STORE

INTRODUCTION

The invention relates to a semiconductor store with storage cells, consisting of a MOS selector transistor which is driven by a drive line, and of storage capacitor which is connected to the selector transistor, in which the selector transistors are produced in the V-MOS-technique.

BACKGROUND OF THE INVENTION

One-transistor storage cells in the MOS technique are known (see e.g. Electronics, Sept. 13, 1973, pages 116 to 121). These one-transistor storage cells consist of a selector transistor and a storage capacitor which is connected to the selector transistor. The selector transistor is connected by its control electrode to the word line of the semiconductor store. The controlled path of the selector transistor lies between the bit line and the storage capacitor. The other terminal of the storage capacitor is connected to a fixed voltage e.g. the voltage VDD. The item of information to be stored in the storage cell is determined by the charge of the storage capacitor. The write-in and read-out of an item of information into and out of the storage cell is effected via the selector transistor when the latter is operated from the word line.

The previous design of one-transistor storage cells in the MOS technique has been such that the storage capacitor is arranged next to the selector transistor on a semiconductor substrate. However, this has the disadvantage that a relatively large amount of space is required for the construction of a storage cell.

It is also known to use the so-called V-MOS technique to produce MOS transistors in a semiconductor substrate (see e.g. Solid State Electronics 1976, Vol. 19, p. 159 to 166, Electronics Letters, Sept. 20, 1973, Vol. 9, No. 19, pages 457 to 458). In this V-MOS technique an epitaxial layer in which the transistor is arranged is applied to a Si semiconductor substrate. Here the control electrode is formed in that into the epitaxial layer there is etched a V-shaped groove which is insulated by an insulating layer composed of silicon dioxide to which the terminal for the control electrode of the transistor is then applied. The controlled electrodes of the transistor can be arranged next to the control electrode in the epitaxial layer. The channel of th MOS transistor is formed in the flanks of the V-shaped groove. The quoted publications should be referred to regarding the properties and advantages of the V-MOS technique and the production process.

BRIEF SUMMARY OF THE INVENTION

The object of this invention is to provide a semiconductor store with one-transistor storage cells, which is constructed in the V-MOS technique. This aim is realized in that in a semiconductor substrate highly doped with impurity centers of one type there is arranged a buried layer which is highly doped with impurity centers of the other type, that above the buried layer and the semiconductor substrate there is arranged an epitaxial layer which is weakly doped with impurity centers of said one type, that a second layer highly doped with impurity centers of the other type is arranged in the surface of the epitaxial layer above the buried layer, that a V-shaped groove is provided which divides the second layer, the epitaxial layer and the buried layer in each case into two separate sub-portions, and that a conductor path is arranged in the V-shaped groove.

By a layer doped with impurity centers of the one type a layer is provided in which for example acceptors are arranged, and which thus is p-doped. Accordingly, a layer doped with impurity centers of the other type is to be understood as a layer in which donors are arranged and thus is n-doped. Naturally the coordination between impurity centers of the one type and doping can also be the reverse.

When the semiconductor substrate is constructed in the V-MOS technique, a storage cell is arranged at each flank of the V-shaped groove. This arrangement arises from the fact that the buried layer present at the boundary surface between the semiconductor substrate and the epitaxial layer and the second layer arranged above the buried layer on the surface of the epitaxial layer is divided into two sub-portions by the elongated V-shaped groove. Then a conductor path which can be part of the word line is arranged in the V-shaped groove, insulated from the layers. Each sub-portion of the second layer forms a bit line. Thus on the one side of the V-shaped groove, a first storage cell is formed from the blocking layer (storage capacitor) consisting of the one sub-portion of the buried layer and the semiconductor, and from the one selector transistor composed of the one sub-portion of the buried layer, the one bit line and the conductor path running in the V-shaped groove. The other storage cell lies on the other side of the V-shaped groove. It consists of the blocking layer (second storage capacitor) formed between the other sub-portion of the buried layer and the semiconductor substrate, and of the second selector transistor composed of the second sub-portion of the buried layer and the second bit line, and of the conductor path running in the V-shaped groove.

Further developments of the invention are described in the sub-claims.

The advantages of the semiconductor storage in accordance with the invention consist in the fact that the selector transistors and the storage capacitors are arranged above one another. A storage cell is in each case formed at each flank of the V-shaped groove.

BRIEF DESCRIPTION OF THE DRAWINGS

The invention will be explained further making reference to an exemplary embodiment which is illustrated in the Figures, in which:

FIG. 1 is a fundamental illustration of a one-transistor storage cell in the MOS technique;

FIG. 2 is a cross-section through a one-transistor storage cell in the known n-channel silicon gate technique;

DESCRIPTION OF THE PREFERRED EMBODIMENTS

Figure 3:
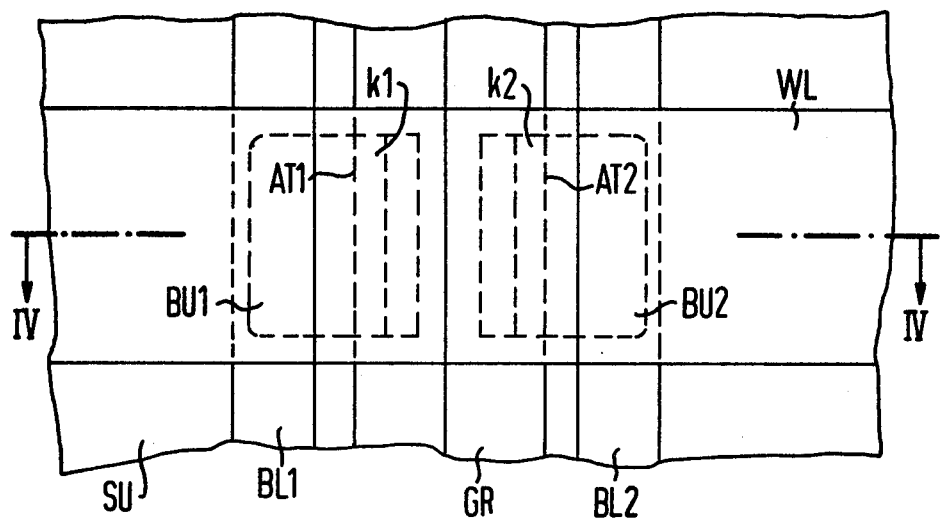
FIG. 3 is a plan view of two one-transistor storage cells in the V-MOS technique.

The known one-transistor storage cell in the MOS technique as illustrated in FIG. 1 consists of a selector transistor AT and a storage capacitor CS. The storage cell is arranged between a word line WL and a bit line BL. The control electrode of the selector transistor AT is connected to the word line WL while the controlled path of the selector transistor AT lies between the bit line BL and the storage capacitor CS. The other terminal of the storage capacitor CS is connected to a fixed voltage VDD. The charge characterizing an item of information is in each case stored in the storage capacitor CS. The charge can be transmitted via the selector transistor AT to the bit line BL. This is effected whenever the word line WL is operated accordingly.

FIG. 2 shows the construction of a one-transistor storage cell in accordance with the known n-channel silicon-gate technique, where the storage capacitor CS and the selector transistor AT are arranged next to one another on a silicon semiconductor substrate SU. The two controlled electrodes SE1 and SE2 are diffused into the semiconductor substrate SU. The control electrode G is arranged between the controlled electrodes SE1 and SE2, partially overlapping the latter, and insulated from the semiconductor substrate SU. The one controlled electrode SE1 lies in the bit line BL. The other controlled electrode SE2 is connected to the storage capacitor CS. The latter is formed with the aid of a conductor path SK which is arranged in insulated fashion above the semiconductor substrate SU. If an appropriate voltage is connected to the conductor path SK, an inversion layer IV, which is connected to the controlled electrode SE2 of the selector transistor AT, forms on the surface of the semiconductor substrate SU. The insulating layers IS required for the realization of the storage capacitor CS. The selector transistor AT can consist of silicon dioxide. The control electrode G of the selector transistor AT can be constructed of polysilicon. In any case, FIG. 2 shows that the storage capacitor CS and the selector transistor AT of the one-transistor storage cell lie next to one another on the semiconductor substrate SU and thus a relatively large amount of space is necessary in order to construct storage cells of this type.

This space requirement can be considerably reduced if the selector transistors are constructed in the V-MOS technique. The arrangement of the storage cells in this technique can best be explained with the assistance of FIG. 4, which is a cross-section through two one-transistor storage cells in the V-MOS-technique.

A layer which is highly n-doped (N+) is diffused into a silicon semiconductor substrate SU which is highly p-doped (p+). Thus a blocking layer, which can be used to construct the storage capacitor, forms between the semiconductor substrate SU and the layer BU which hereinafter will be referred to as the buried layer.

An epitaxial layer E is formed on the buried layer BU and the semiconductor substrate SU. This epitaxial layer E is weakly p-doped (p−).

A second layer which is highly n-doped (n+) is diffused-in and spaced above the buried layer BU on the surface of the epitaxial layer E. Then this second layer, the epitaxial layer E and the buried layer BU are completely divided into two subportions by means of a V-shaped groove Gr. Thus two sub-portions BU1 and BU2 are formed in the buried layer BU, and two sub-portions BL1 and BL2 are formed in the second layer, which are no longer joined to one aother. An insulating layer IS which may consist, for example, of silicon dioxide is applied to the epitaxial layer E, including the V-shaped groove GR. Onto this insulating layer S there is formed a conductor path which also passes through the V-shaped groove GR. This conductor path can consist of polysilicon and can be the word line WL of the storage cells.

In this way a storage cell is formed on each flank of the V-shaped groove GR. The storage capacitor of the first storage cell is formed from the blocking layer between the first sub-portion BU1 of the buried layer BU and the semiconductor substrate SU. The selector transistor AT1 of the first storage cell consists of the first sub-portion BU1 of the buried layer, of the bit line BL1 and of the conductor path portion LB1 in the V-shaped groove GR. As a result of the operation of the word line WL a channel K1 is formed between the bit line BL1 and the sub-portion BU1 of the buried layer. The storage capacitor of the first storage layer is indicated by the capacitance CS1.

The second storage cell which lies on the other flank of the V-shaped groove GR, consists of the storage capacitor, formed from the blocking layer between the second sub-portion BU2 of the buried layer BU and the semiconductor substrate SU, and of the second transistor AT2, formed from the second sub-portion BU2 of the buried layer, of the second bit line BL2 and the conductor path portion LB2 in the V-shaped groove GR. When an appropriate voltage is again connected to the word line WL, a channel K2 forms between the second subportion BU2 of the buried layer and the bit line BL2.

The semiconductor substrate SU is connected to a fixed voltage e.g., VBB. If the word line WL is then connected to an appropriate voltage, in this case a positive voltage, the two selector transistors AT1 and AT2 are brought into the conductive state and a charge transfer is possible between the sub-portions BU1 and BU2 of the buried layer and the bit lines BL1 and BL2 via the channels K1 and K2.

FIG. 3 shows the extend of the storage cells. The storage cells are in each case arranged within the surface formed by the intersection of the bit line BL1 and BL2 and the word line WL. These storage cells each consist of the divided buried layer BU, thus the sub-portions BU1 and BU2. The magnitude of the storage capacitance of the storage capacitors formed by the blocking layers between the sub-portions of the buried layer and the semiconductor substrate is determined by the doping of the buried layer and the semiconductor substrate, and by the size of the sub-portions of the buried layer. As a result of the high degree of doping of the buried layer and of the semiconductor substrate SU, a high capacitance of the storage capacitors is achieved.

FIG. 3 also shows the longitudinal extent of the V-shaped groove GR. It can clearly be seen that this groove GR divides the second layer into the two bit lines BL1 and BL2, and extends beyond the surface of the storage cells. The channels K1 and K2 of the selector transistor AT1 and AT2 are also shown in FIG. 3. These have a longitudinal extent in the order of the buried layer.

In order to improve the properties of the storage cells, a self-conductive layer $\pi$ can be arranged between the bit lines BL1, BL2 and the buried layer. This self-conductive layer $\pi$ shortens the length of the channels K1 and K2 (see e.g. Electronics Dec. 25, 1975, p. 50).

Figure 4:
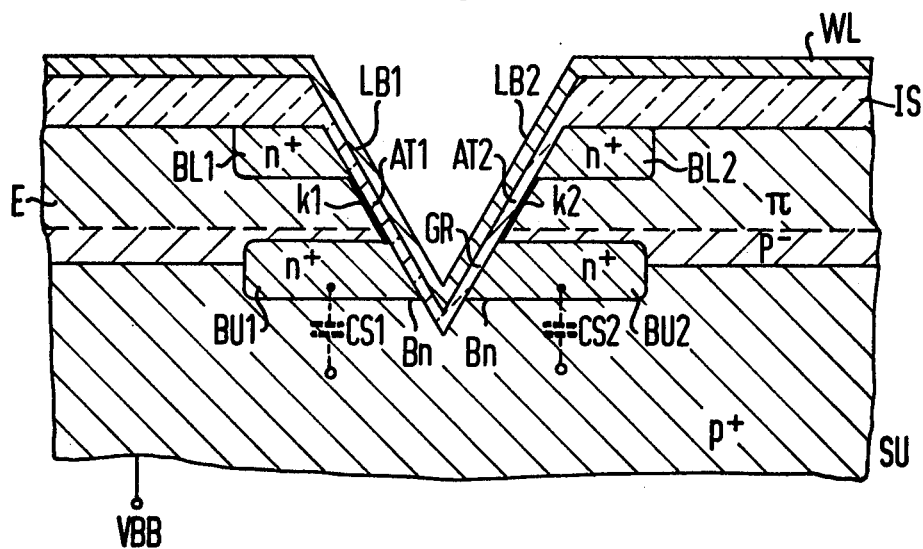
FIG. 4 is a cross-section through two one-transistor storage cells in the V-MOS technique.

FIG. 4 illustrates the construction of the storage cells in the n-silicon-gate technique. It can naturally also be designed in the p-channel technique. The word line can consist of polysilicon, but can also be in the form of a metal line.

By way of example, the doping concentrations of the individual layers may have the following values:

$p^+ \approx 2 \cdot 10^{16}$ disturbing atoms/cm$^3$
$p^- \approx 3 \times 10^{15}$ disturbing atoms/cm$^3$
$n+ \approx 10^{20}$ disturbing atoms/cm$^3$

We claim as our invention:

1. A semiconductor store comprising a semiconductor substrate of a highly doped semiconductor material of one conductivity type, an epitaxial layer on one surface of said substrate of the same conductivity type and of low doping, a buried layer lying partly in said substrate and partly in said epitaxial layer, said buried layer being of the pposite conductivity type and of high doping, a highly doped second layer of the same conductivity type as said buried layer in the outer surface of said epitaxial layer, a V-shaped groove extending through said second layer, said epitaxial layer and through said buried layer and penetrating into said substrate, an insulating layer covering said epitaxial layer and the walls of said V-shaped groove, a layer of conductive material covering said insulating layer, in each side of said groove there being arranged a selector transistor which consists of a sub-portion of said buried layer, a sub-portion of said second layer and a conductor path portion of said conductor path, and said storage capacitor which is connected to said selector transistors consisting of a blocking layer which is formed by a sub-portion of said buried layer and said semiconductor substrate.

2. A semiconductor store with storage cells having a MOS-selector transistor, a drive line, and a storage capacitor connected to said selector transistor, the combination comprising a selector transistor of the V-MOS type in a semiconductor substrate highly doped with impurity of one type, a buried layer highly doped with impurity centers of the other type formed in said substrate, an epitaxial layer weakly doped with impurity centers of said one type arranged above said buried layer and said semiconductor substrate, a second layer highly doped with impurity centers of said other type being arranged in the surface of said epitaxial layer above said buried layer, a V-shaped groove dividing said second layer and said buried layer into two separate sub-portions, a conductor path formed in said V-shaped groove, in each side of said groove there being arranged a selector transistor which consists of a sub-portion of said buried layer, a sub-portion of said second layer and a conductor path portion of said conductor path, and said storage capacitor which is connected to said selector transistors consisting of a blocking layer which is formed by a sub-portion of said buried layer and said semiconductor substrate.

3. A semiconductor store as claimed in claim 2, in which each sub-portion of said second layer is arranged in a bit line, and the conductor path lies in said V-shaped groove in a word line arranged at right angles to said bit line.

4. A semiconductor store as claimed in claim 3, in which said word line is formed of polysilicon.

5. A semiconductor store as claimed in claim 2, in which a self-conductive layer is arranged between said buried layer and said bit lines in said epitaxial layer.

* * * * *